(12) United States Patent
Park

(10) Patent No.: US 6,599,825 B2
(45) Date of Patent: Jul. 29, 2003

(54) METHOD FOR FORMING WIRING IN SEMICONDUCTOR DEVICE

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/323,021

(22) Filed: Dec. 18, 2002

(65) Prior Publication Data

US 2003/0119294 A1 Jun. 26, 2003

(30) Foreign Application Priority Data

Dec. 20, 2001 (KR) .................................. 2001-0081812

(51) Int. Cl.[7] ......................................... H01L 21/4763
(52) U.S. Cl. ....................... 438/618; 438/620; 438/637; 438/638; 438/639
(58) Field of Search ................................ 438/618, 620, 438/637, 638, 639, 589, 391, 424, 430, 442, 437, 413, 427, 429, 432, 435, 243–244

(56) References Cited

U.S. PATENT DOCUMENTS

| | | | | |
|---|---|---|---|---|
| 4,920,065 A | * | 4/1990 | Chin et al. ..................... | 437/52 |
| 4,977,439 A | * | 12/1990 | Esquivel et al. ............ | 357/490 |
| 5,479,041 A | | 12/1995 | Lur et al. | |
| 5,510,298 A | * | 4/1996 | Redwine ..................... | 437/203 |
| 5,521,114 A | * | 5/1996 | Rajeevakumar .............. | 437/60 |
| 5,677,219 A | * | 10/1997 | Mazureet et al. ............. | 437/52 |
| 5,726,084 A | * | 3/1998 | Boyd et al. .................. | 438/239 |
| 5,830,797 A | * | 11/1998 | Cleeves ....................... | 438/618 |
| 6,054,385 A | * | 4/2000 | Gardner et al. .............. | 438/618 |
| 6,071,803 A | * | 6/2000 | Rutten et al. ................ | 438/618 |
| 6,140,175 A | * | 10/2000 | Kleinhenz et al. .......... | 438/243 |
| 6,207,494 B1 | * | 3/2001 | Graimann et al. ........... | 438/391 |
| 6,228,706 B1 | * | 5/2001 | Horak et al. ................. | 438/244 |
| 6,333,274 B2 | * | 12/2001 | Akatsu et al. ............... | 438/745 |
| 6,355,529 B2 | * | 3/2002 | Heo et al. .................... | 438/589 |
| 6,362,092 B1 | | 3/2002 | Shieh et al. | |
| 6,373,091 B2 | * | 4/2002 | Horak et al. ................. | 438/244 |
| 2001/0044188 A1 | * | 11/2001 | Heo et al. .................... | 438/243 |
| 2002/0137278 A1 | * | 9/2002 | Temmler et al. ............. | 438/243 |

* cited by examiner

Primary Examiner—John F. Niebling
Assistant Examiner—Lynne A Gurley
(74) Attorney, Agent, or Firm—Timothy J. Keefer; Wildman, Harrold, Allen & Dixon

(57) ABSTRACT

A method for forming wiring in a semiconductor device comprises the steps of: forming a trench in a desired place on a silicon substrate, forming a thermal oxidation layer on the surface of the trench, forming wiring by filling a conductive layer in the lower part of the trench, forming an insulating layer on the wiring, removing the thermal oxidation layer over the insulating layer, forming an epitaxial silicon layer so that the trench is filled completely, forming a contact hole exposing the wiring by etching the epitaxial silicon layer and the insulating layer, forming an insulating spacer on the side walls of the contact hole, and forming a wiring plug in the contact hole in which the insulating layer has been formed. In the method for forming such wiring in the semiconductor device, metal wiring is formed in the silicon substrate.

11 Claims, 3 Drawing Sheets

METHOD FOR FORMING WIRING IN SEMICONDUCTOR DEVICE

BACKGROUND OF THE INVENTION

1. Field of the Invention

The present invention relates to a method for forming wiring in a semiconductor device, and more particularly to a method for forming wiring in a silicon substrate of the semiconductor device.

2. Description of the Prior Art

As generally known in the art, a semiconductor device is fabricated in a stacked structure, and wiring is correspondingly formed in a multi-layer structure that is easy in design.

When the above noted semiconductor device with stacked structure is fabricated, surface planarization is more important than anything else because it affects the following photo and etch processes.

Accordingly, a dual damascene process has been widely employed in order to achieve a surface planarization in recent wiring processes, in particular, in metal wiring processes.

As generally known in the art, the dual damascene process includes the steps of: forming a contact hole for an electrical connection with lower wiring in an interlayer insulating layer, forming a trench for defining upper wiring region, depositing wiring materials to fill the contact hole and the trench, and chemical-mechanical polishing (CMP) the wiring materials in order to expose the interlayer insulating layer.

However, as regards the conventional wiring formation method, including the dual damascene process, although many studies have been undertaken regarding processing technology, wiring formation has been neglected. Accordingly, wiring has been complicated and a step differential has become larger following the increase of the degree of integration of the semiconductor device, resulting in several problems regarding the characteristics of the semiconductor device and the fabrication process.

SUMMARY OF THE INVENTION

Accordingly, the present invention has been made to solve the above-mentioned problems occurring in the prior art, and an object of the present invention is to provide a method for forming wiring in a semiconductor device, which is easy for designing wiring in the semiconductor device and can obviate problems incurred due to step differential.

In order to accomplish this object, there is provided a method for forming wiring in a semiconductor device, comprising the steps of: forming a trench in a desired place on a silicon substrate, forming a thermal oxidation layer on the surface of the trench, forming wiring by filling a conductive layer in the lower part of the trench, forming an insulating layer on the wiring, removing the thermal oxidation layer over the insulating layer, forming an epitaxial silicon layer so that the trench is filled completely, forming a contact hole exposing the wiring by etching the epitaxial silicon layer and the insulating layer, forming an insulating spacer on the side walls of the contact hole, and forming a wiring plug in the contact hole in which the insulating layer has been formed.

In the above embodiment of the present invention, the trench has a depth of 0.5 to 1.0 μm.

Further, the step of forming the trench comprises: depositing a first insulating layer and a second insulating layer sequentially on the silicon substrate, exposing a predetermined part of the substrate by etching the first and second insulating layers, and etching the exposed part of the substrate.

Also, the first insulating layer is composed of thermal oxidation layer, and the second layer is composed of nitride layer.

Additionally, the insulating layer is composed of materials having high dry-etch and wet-etch selection ratios.

Also, in this embodiment of the present invention, the step of forming the spacer comprises: forming a thermal oxidation layer on the surface of the contact hole and the substrate by thermal oxidizing the resultant structure of the substrate in which the contact hole has been formed and then blanket etching the thermal oxidation layer.

In accordance with another embodiment of the present invention, there is provided a method for forming wiring in a semiconductor device, comprising the steps of: depositing a first insulating layer and a second insulating layer sequentially on the silicon substrate, exposing a predetermined part of the substrate by etching the first and second insulating layers, forming a trench by etching the exposed part of the substrate, forming a third insulating layer on the surface of the trench by thermal oxidation, depositing wiring materials to fill the trench, forming wiring in the lower part of the trench by etching back the wiring materials, forming a fourth insulating layer on the wiring, removing the third insulating layer on the fourth insulating layer, forming an epitaxial silicon layer so that the trench can be completely filled, forming a contact hole exposing the wiring by etching the epitaxial silicon layer and the fourth insulating layer, forming a fifth insulating layer at a side wall of the contact hole, removing the first and second insulating layers, and forming a wiring plug in the contact hole in which the fifth insulating layer has been formed.

In this embodiment of the present invention, the first insulating layer, the third insulating layer and the fifth insulating layer are all made of thermal oxidation layer.

Also, the fourth insulating layer is made of materials having a high dry-etch and wet-etch selection rate with respect to the second insulating layer and the third insulating layer.

Further, in this embodiment of the present invention, the step of forming the fifth insulating layer comprises: thermal oxidizing the resultant structure of the substrate in which the contact hole has been formed and then blanket etching the fifth insulating layer formed by the thermal oxidation in order to form a spacer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
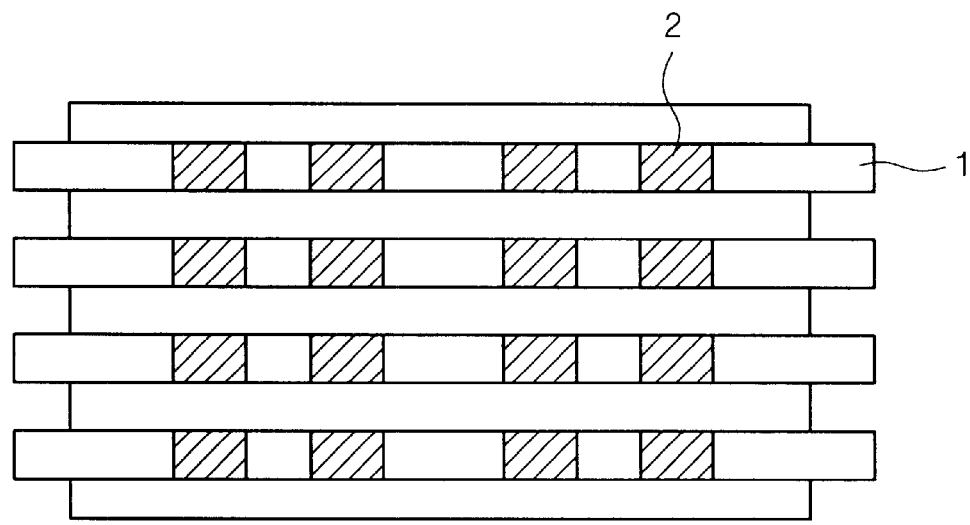
FIG. 1 is a view showing a layout of a wiring mask and a contact mask employed in a method for forming wiring in a semiconductor device in accordance with the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2A:
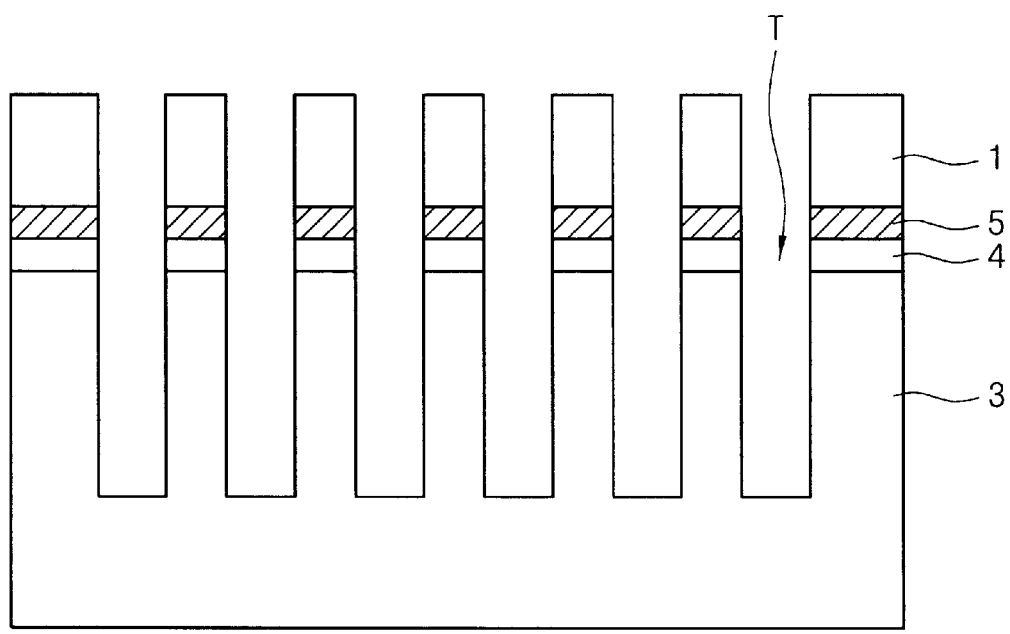
FIGS. 2A to 2F are cross-sectional views for illustrating each step of the method for forming wiring in a semiconductor device in accordance with the present invention.

Referring to FIG. 2A, a first insulating layer 4 made of thermal oxidation layer and a second insulating layer made of nitride layer are formed sequentially on a silicon substrate 3. The first insulating layer 4 and the second insulating layer 5 are dry etched after the formation of a wiring mask 1 on the second insulating layer 5. Then, the exposed silicon substrate 3 is etched to a depth of 0.5 to 1.0 μm to result in the formation of a trench T.

Figure 2B:
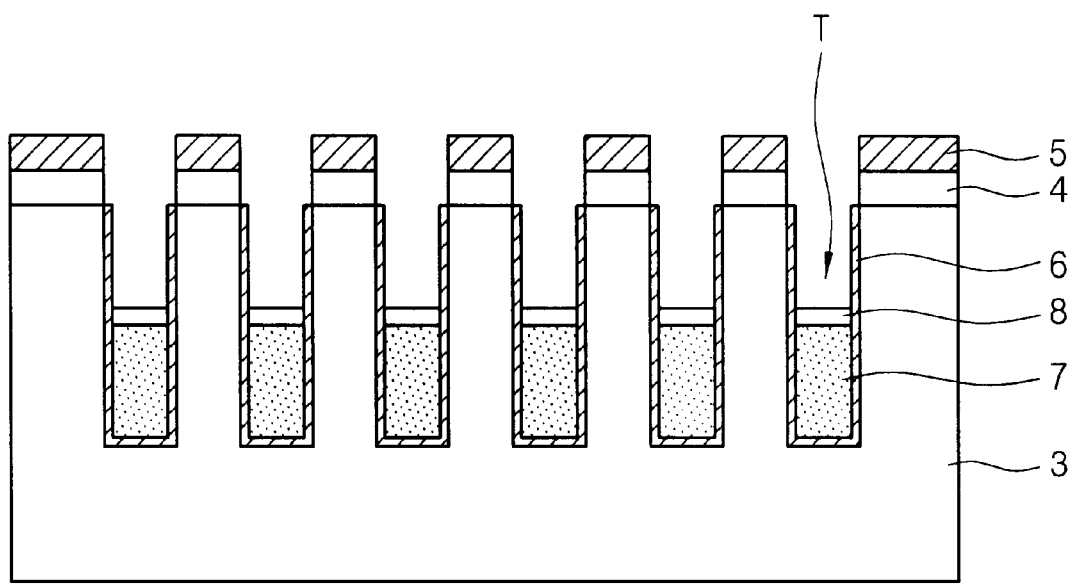

Referring to FIG. 2B, the wiring mask 1 is removed, and a third insulating layer 6 made of thermal oxidation layer is formed on the surface of the trench by thermal oxidizing the resultant structure of the substrate. Then, the inner part of the trench is filled with wiring materials, wiring 7 is formed in the lower part of the trench T by etching back the wiring materials, and a fourth insulating layer 8 is formed on the resultant structure of the substrate. Next, the fourth insulating layer 8 is etched back to remain on the wiring 7, thereby forming an embedded conductor in the trench T. The fourth insulating layer 8 is made of materials that have not only a high dry-etch selection rate but a high wet-etch selection rate with respect to the second insulating layer 5 and the third insulating layer 6.

Figure 2C:
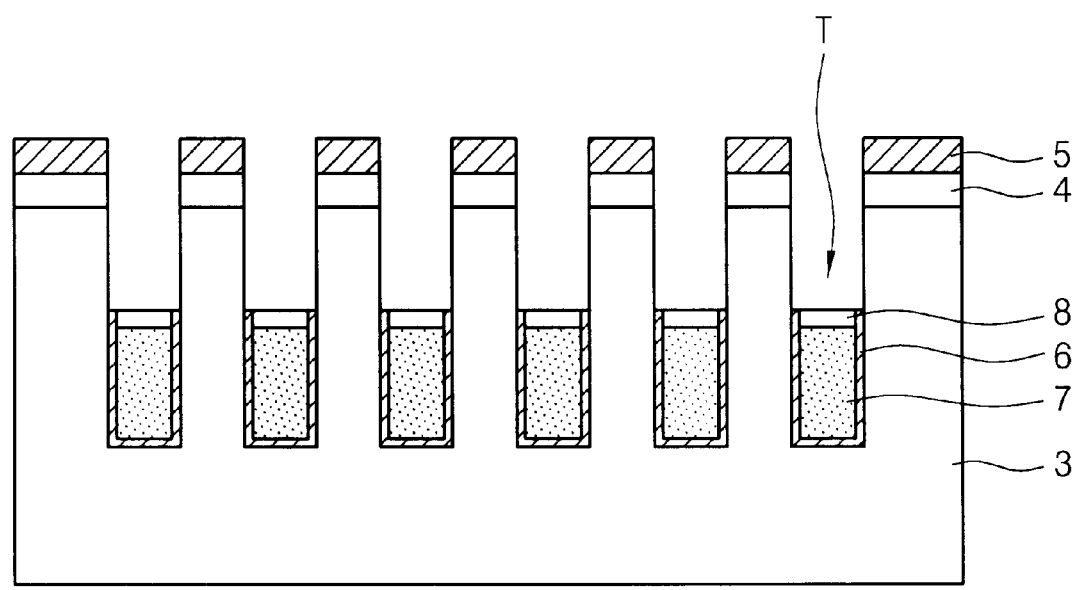

Referring to FIG. 2C, the third insulating layer 6 formed on the surface of the trench in the fourth insulating layer 8 is removed by using a high selection rate of wet etching with respect to the fourth insulating layer 8.

Figure 2D:
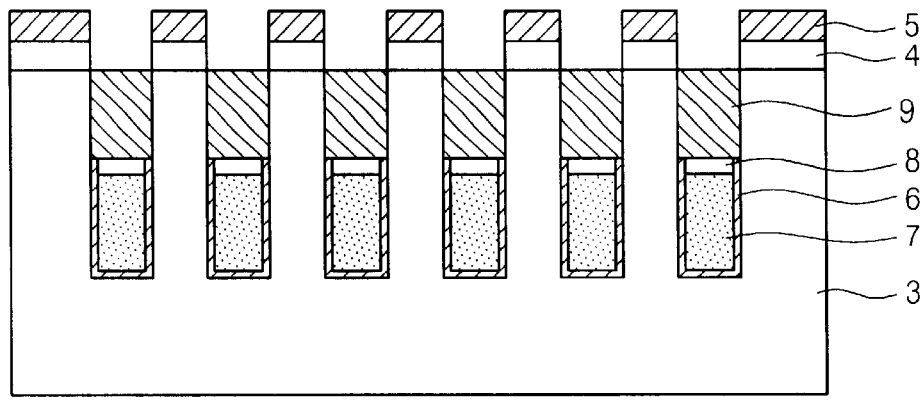

Referring to FIG. 2D, an epitaxial silicon layer 9 is formed on the resultant structure of the substrate by an epitaxial silicon growth process, and then the epitaxial silicon layer 9 is etched back so that just the trench can be filled.

Figure 2E:
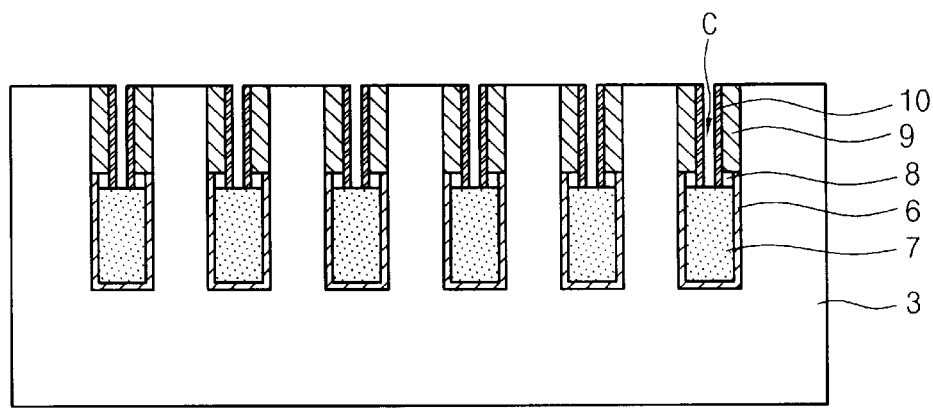

Next, as shown in FIG. 2E, the epitaxial silicon layer 9 and the fourth insulating layer 8 are dry etched using the contact mask shown in FIG. 1, thereby producing another contact hole C exposing the wiring 7. Then, a blanket etching is performed to leave the fifth insulating layer on the surface of the contact hole C as a spacer, and the first insulating layer (4) and the second insulating layers (5) are removed.

Figure 2F:
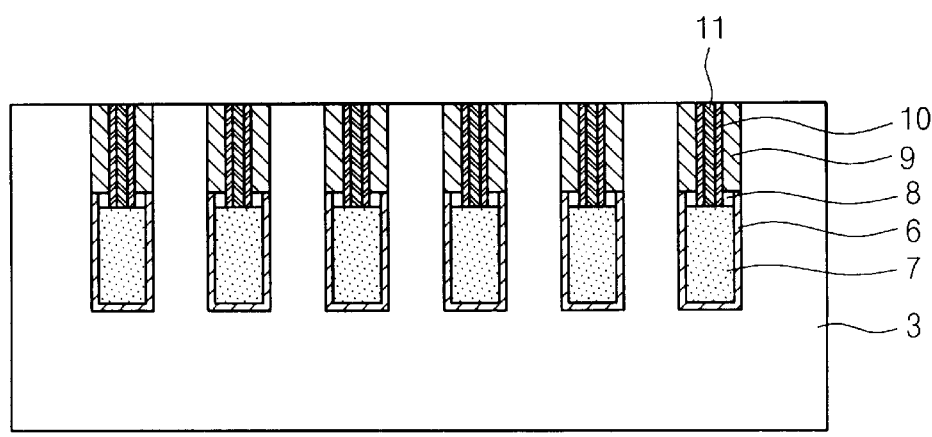

Subsequently, as shown in FIG. 2F, wiring connection materials are deposited on the resultant structure of the substrate to fill the contact hole. Then, the wiring connection materials are subjected to CMP processing or etched back to expose the substrate, thereby resulting in the production of the wiring plug 11 in the contact hole.

In accordance with the method for forming wiring in a semiconductor device of the present invention, the wiring in the semiconductor device is formed in the semiconductor device. Although wiring structures tend to become complicated along with the increase of the degree of integration of the devices, in this case, it is easy to design the wiring as it is formed in the semiconductor device. In particular, the problems occurring in the process of forming the wiring which result from step differentials can be settled because step differentials do not occur in the formation of the wiring in the substrate.

Thus, according to the method for forming the wiring in the semiconductor device of the present invention, it is possible to improve the characteristics of the semiconductor device and its reliability because it is easy to design the wiring, and the present method offers advantages in the process of forming the wiring in the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a wiring in a semiconductor device, comprising the steps of:

forming a trench in a desired place on a silicon substrate;

forming a thermal oxidation layer on the surface of the trench;

forming wiring by filling a conductive layer in the lower part of the trench;

forming an insulating layer on the wiring;

removing the thermal oxidation layer over the insulating layer;

forming an epitaxial silicon layer so that the trench is filled completely;

forming a contact hole exposing the wiring by etching the epitaxial silicon layer and the insulating layer;

forming an insulating spacer on the side walls of the contact hole; and forming a wiring plug in the contact hole in which the insulating layer has been formed.

2. The method for forming wiring according to claim 1, wherein the trench has a depth of 0.5 to 1.0 μm.

3. The method for forming wiring according to claim 1, herein the step of forming the trench comprises:

depositing a first insulating layer and a second insulating layer sequentially on the silicon substrate;

exposing predetermined part of the substrate by etching the first and second insulating layers; and etching the exposed part of the substrate.

4. The method for forming wiring according to claim 3, wherein the first insulating layer is composed of thermal oxidation layer, and the second layer is composed of nitride layer.

5. The method for forming wiring according to claim 1, wherein the insulating layer is composed of materials having high dry-etch and wet-etch selection rate.

6. The method for forming wiring according to claim 1, wherein the step of forming the spacer comprises the steps of:

forming a thermal oxidation layer on the surface of the contact hole and the substrate by thermal oxidizing the resultant structure of the substrate in which the contact hole has been formed; and blanket etching the thermal oxidation layer.

7. A method for forming wiring in a semiconductor device, comprising the steps of:

depositing a first insulating layer and a second insulating layer sequentially on the silicon substrate;

exposing a predetermined part of the substrate by etching the first and second insulating layers;

forming a trench by etching the exposed part of the substrate;

forming a third insulating layer on the surface of the trench by thermal oxidation;

depositing wiring materials to fill the trench;

forming wiring in the lower part of the trench by etching back the wiring materials;

forming a fourth insulating layer on the wiring;

removing the third insulating layer on the fourth insulating layer;

forming an epitaxial silicon layer so that the trench can be completely filled;

forming a contact hole exposing the wiring by etching the epitaxial silicon layer and the fourth insulating layer;

forming a fifth insulating layer at the side wall of the contact hole;

removing the first and second insulating layers;

forming a wiring plug in the contact hole in which the fifth insulating layer has been formed.

8. The method for forming wiring according to claim 7, wherein the trench has a depth of 0.5 to 1.0 μm.

9. The method for forming wiring according to claim 7, wherein the first insulating layer, the third insulating layer and the fifth insulating layer are made of thermal oxidation layer.

10. The method for forming wiring according to claim 7, wherein the fourth insulating layer is made of materials having a high dry-etch and wet-etch selection rate with respect to the second insulating layer and the third insulating layer.

11. The method for forming wiring according to claim 7, wherein the step of forming the fifth insulating layer comprises the steps of:

thermal oxidizing the resultant structure of the substrate in which the contact hole has been formed; and blanket etching the fifth insulating layer formed by the thermal oxidation in order to form a spacer.

\* \* \* \* \*